US007889028B2

(12) United States Patent
Hessler et al.

(10) Patent No.: US 7,889,028 B2
(45) Date of Patent: Feb. 15, 2011

(54) COUPLED RESONATOR FOR REGULATING SYSTEM

(75) Inventors: Thierry Hessler, Renens (CH); Kaspar Trümpy, Soleure (CH)

(73) Assignee: The Swatch Group Research and Development Ltd, Marin (CH)

( * ) Notice: Subject to any disclaimer, the term of this patent is extended or adjusted under 35 U.S.C. 154(b) by 314 days.

(21) Appl. No.: 12/294,652

(22) PCT Filed: Apr. 3, 2007

(86) PCT No.: PCT/EP2007/053276

§ 371 (c)(1),
(2), (4) Date: Sep. 26, 2008

(87) PCT Pub. No.: WO2007/115985

PCT Pub. Date: Oct. 18, 2007

(65) Prior Publication Data

US 2010/0283556 A1 Nov. 11, 2010

(30) Foreign Application Priority Data

Apr. 7, 2006 (EP) .................................. 06007397

(51) Int. Cl.

| | |
|---|---|
| ***H03H 9/15*** | (2006.01) |
| ***H03H 9/21*** | (2006.01) |
| ***G04B 17/06*** | (2006.01) |
| ***G04B 17/20*** | (2006.01) |
| ***G04C 3/08*** | (2006.01) |
| ***G04F 5/04*** | (2006.01) |

(52) U.S. Cl. ....................... 333/200; 310/370; 368/167; 368/168; 368/184; 968/103; 968/109; 968/110; 968/135; 968/480

(58) Field of Classification Search ................. 333/200; 310/370; 368/159, 167–170, 175, 184; 968/103, 968/108–111, 135, 480, 482
See application file for complete search history.

(56) References Cited

U.S. PATENT DOCUMENTS

| | | | | |
|---|---|---|---|---|
| 3,735,971 | A * | 5/1973 | Steinemann | 267/182 |
| 3,736,743 | A * | 6/1973 | Koike | 368/200 |
| 3,937,001 | A | 2/1976 | Berney | |
| 4,069,434 | A * | 1/1978 | Kawai et al. | 310/348 |
| 4,377,765 | A * | 3/1983 | Kogure et al. | 310/312 |
| 5,517,469 | A | 5/1996 | Wiget | |
| 5,690,193 | A | 11/1997 | Baumann et al. | |

(Continued)

FOREIGN PATENT DOCUMENTS

| | | |
|---|---|---|
| CH | 443 748 | 2/1968 |

(Continued)

OTHER PUBLICATIONS

International Search Report issued in corresponding application No. PCT/EP2007/053276, completed Sep. 7, 2007 and mailed Sep. 25, 2007.

*Primary Examiner*—Barbara Summons
(74) *Attorney, Agent, or Firm*—Griffin & Szipl, P.C.

(57) ABSTRACT

The coupled resonator comprises a first low frequency resonator, such as a balance spring (1) and a second higher frequency resonator, such as a tuning fork (2), the two resonators (1 and 2) including permanent mechanical coupling means. Application to the regulating system of a timepiece.

12 Claims, 2 Drawing Sheets

U.S. PATENT DOCUMENTS

| | | | |
|---|---|---|---|
| 5,740,131 | A | 4/1998 | Bernasconi |
| 5,751,666 | A | 5/1998 | Farine et al. |
| 7,306,364 | B2 | 12/2007 | Born et al. |

FOREIGN PATENT DOCUMENTS

| | | |
|---|---|---|
| CH | 615 314 | 1/1980 |
| EP | 0 679 968 | 10/1995 |
| EP | 0 732 243 | 9/1996 |
| EP | 0 806 710 | 11/1997 |
| EP | 0 822 470 | 2/1998 |
| EP | 0 848 306 | 6/1998 |
| EP | 0 935 177 | 8/1999 |
| EP | 1 521 141 | 4/2005 |
| FR | 563 314 | 12/1923 |
| FR | 2 114 016 | 6/1972 |
| GB | 1 138 818 | 1/1969 |

* cited by examiner

COUPLED RESONATOR FOR REGULATING SYSTEM

This is a National Phase Application in the United States of International Patent Application No. PCT/EP2007/053276 filed Apr. 3, 2007, which claims priority on European Patent Application No. 06007397.0, filed Apr. 7, 2006. The entire disclosures of the above patent applications are hereby incorporated by reference.

FIELD OF THE INVENTION

The present invention concerns a coupled resonator for a regulating system, i.e. an assembly formed of two resonators, the coupling of which stabilises a frequency and thus makes it more independent of external influences. The invention will be illustrated more specifically by the regulating system of a mechanical timepiece movement for which isochronism is a quality criterion.

BACKGROUND OF THE INVENTION

Numerous devices have already been proposed for stabilising the frequency of a sprung balance regulating system. GB Patent No. 1 138 818, published in 1967, discloses a coupling device wherein the vibrations of a first oscillator excite a tuning fork via shocks, i.e. without any direct mechanical link. More recent regulating devices rely essentially on devices associating a mechanical regulator, such as a sprung balance, associated by electromagnetic coupling with an electronic regulator, said coupling being essentially achieved by means of magnets arranged in the arms or in the felloe of the balance. This type of device has been disclosed, for example, in U.S. Pat. No. 3,937,001. Numerous improvements have been made to this basic device; essentially concerning the design or arrangement of the magnets, the electronic circuit and the second resonator, and the energy source necessary for powering said electronic circuit. Such improvements are for example disclosed in EP Patent Nos. 0 679 968, 0 732 243, 0 806 710, 0 822 470, 0 848 306, 0 935 177 and 1 521 141.

All of these coupling devices have the drawback of being either unreliable, or requiring the assembly of a large number of components whose peculiar functions have to be adjusted in relation to each other, which eventually contributes to greatly increasing the cost of the final product.

SUMMARY OF THE INVENTION

It is thus an object of the present invention to overcome the drawbacks of the aforecited prior art by providing a coupled resonator of simpler and more reliable design.

The invention therefore concerns a coupled resonator including a first low frequency resonator, for example of the order of several hertz and a second higher frequency resonator, for example of the order of 100 Hz. The invention is characterized in that the first resonator and the second resonator comprise permanent mechanical coupling means for stabilising the frequency in the event of external interference, for example in the event of shocks.

The two resonators can be manufactured separately in identical or different materials, then mechanical assembled by any means known to those skilled in the art, such as by bonding, rivets, welding or snap fit.

The two resonators can also be manufactured in a single piece in a single material.

The materials used must have a certain elastic constant and may for example be chosen from among metals or alloys, or amorphous, monocrystalline or polycrystalline materials, such as glass, quartz and silicon or its compounds.

The invention will be more particularly illustrated by a coupled resonator formed by a balance spring and a tuning fork, this type of resonator being able to be incorporated in the regulating system of a timepiece, in particular a wristwatch, likely to undergo shocks.

BRIEF DESCRIPTION OF THE DRAWINGS

Other features and advantages of the present invention will appear in the following description of an example embodiment, concerning the regulating system of a mechanical timepiece movement, given by way of non-limiting illustration, with reference to the annexed drawings, in which.

DETAILED DESCRIPTION OF THE INVENTION

Figure 1:
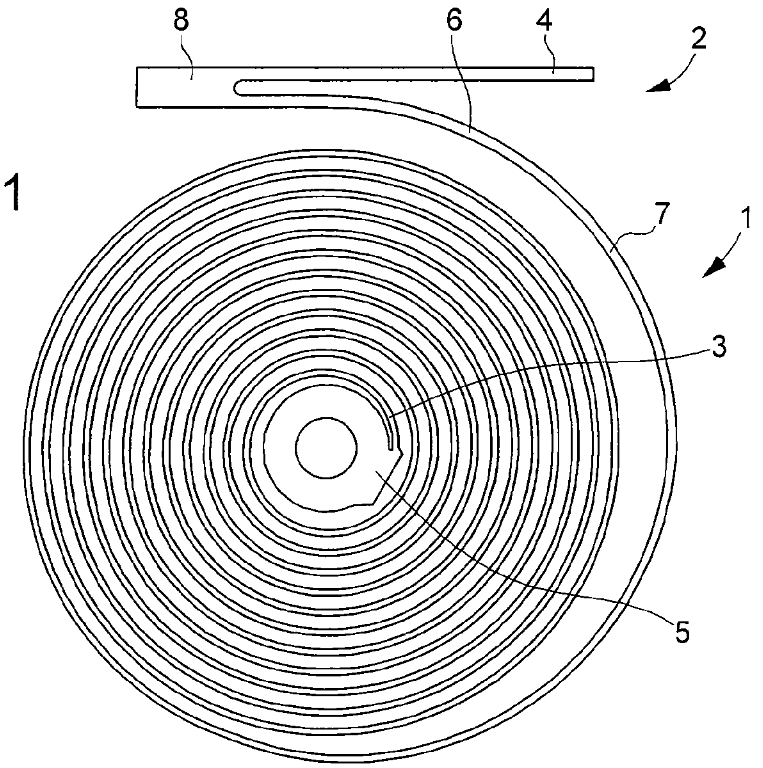
FIG. 1 shows a first embodiment.

The invention will be more particularly illustrated by the coupled resonator shown in FIG. 1 for maintaining the isochronism of a mechanical timepiece movement.

It basically includes a first resonator formed by a balance spring 1 typically having a frequency of the order of several hertz and a second resonator formed by a tuning fork 2, typically having a frequency of the order of hundreds of hertz. The inner terminal curve 3 of balance spring 1 is fixed in a conventional manner to a collet 5 to secure it to a balance staff and tuning fork 2 comprises, also in a known manner, two arms 4, 6 connected by a foot 8. Foot 8 of tuning fork 2 is secured in a known manner to a fixed part of the timepiece movement, such as the balance cock.

As can be seen, balance spring 1 and tuning fork 2 are permanently mechanically connected, in this embodiment, arm 6 of tuning fork 2 is extended by the outer curve 7 of balance spring 1.

In other words, the two resonators are made in a single piece, by known techniques that depend upon the materials used. These materials are obviously materials having a certain elastic constant "k", such as metals and alloys, or amorphous, monocrystalline or polycrystalline materials, such as glass, quartz, silicon or its compounds.

The techniques for shaping these materials by stamping, LIGA, etching, photolithography, or other techniques are well known to those skilled in the art and will not therefore be described any further.

This basic embodiment will form an example hereinafter showing how this coupling has a favourable effect upon frequency stabilisation.

Figure 2:
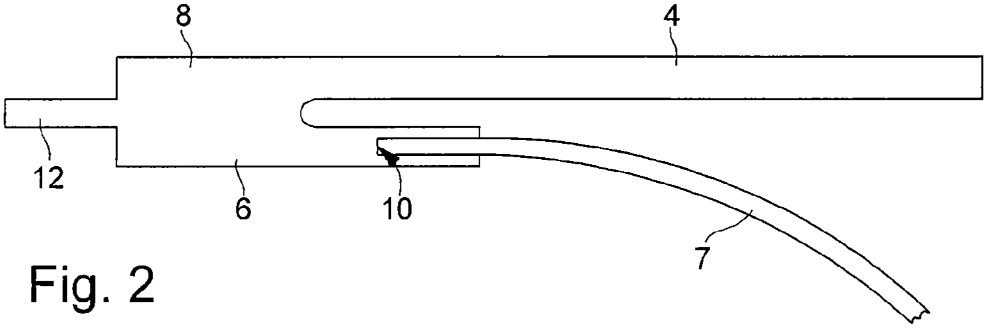
FIG. 2 is a partial diagram of a second embodiment.

FIG. 2 shows a variant. This variant differs from the preceding embodiment in that the first resonator, namely balance spring 1, and the second resonator, namely tuning fork 2, are initially two independent parts able to be made of different materials. A mechanical connection is created between these two parts. In the example shown, arm 6 of tuning fork 2 comprises a notch 10 in which the end of the outer curve 7 of the balance spring is engaged, the mechanical connection then possibly being completed by bonding. Other modes of mechanical connection, well known to those skilled in the art, are evidently possible. In the embodiment shown, foot 8 of tuning fork 2 further comprises a neck 12 for attachment to a fixed part of the timepiece movement, and able to influence the coupling constant "$k_c$" between the two resonators.

Figure 3:
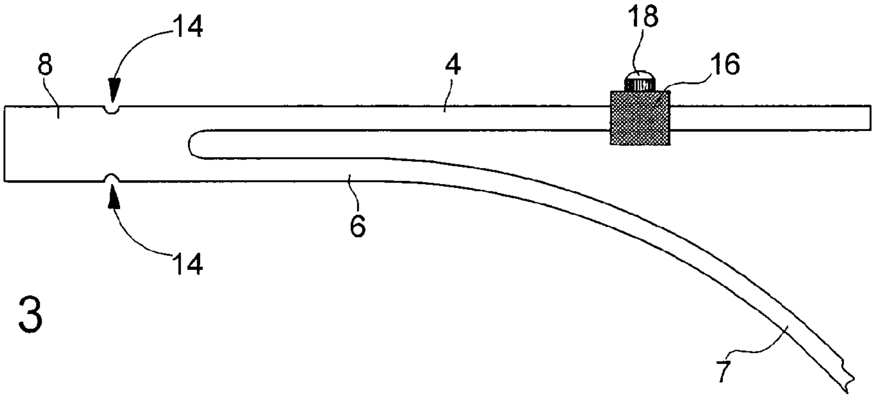
FIG. 3 is a partial diagram of a third embodiment.

FIG. 3 shows other variants providing great freedom for adjusting coupling constant "$k_c$" between the first and second resonator and the natural frequency of the second resonator. As can be seen, foot 8 can comprise recesses 14 in the material that will enable the coupling constant "$k_c$" to be altered. They could also be made on any other part of tuning fork 2, particularly on the free arm 4 to alter the mass "m" thereof and thus the natural frequency of the tuning fork. Conversely, according to an embodiment that is not shown, it could be possible to add mass at any place on the second resonator.

FIG. 3 also shows another variant, which may be combined with the preceding variant, to alter the natural frequency of the first resonator. The free arm 4 comprises an inertia block 16, mobile on said arm 4 and able to be immobilised at a determined place, for example by means of a tightening screw 18.

According to another variant that is not shown, when tuning fork 2 is made of quartz along crystallographic axes for obtaining a piezoelectric effect, electrodes can be provided on arms 4, 6 to generate electrical energy. In the case of a wristwatch, this energy could be used, for example, for lighting the dial.

Figure 4:
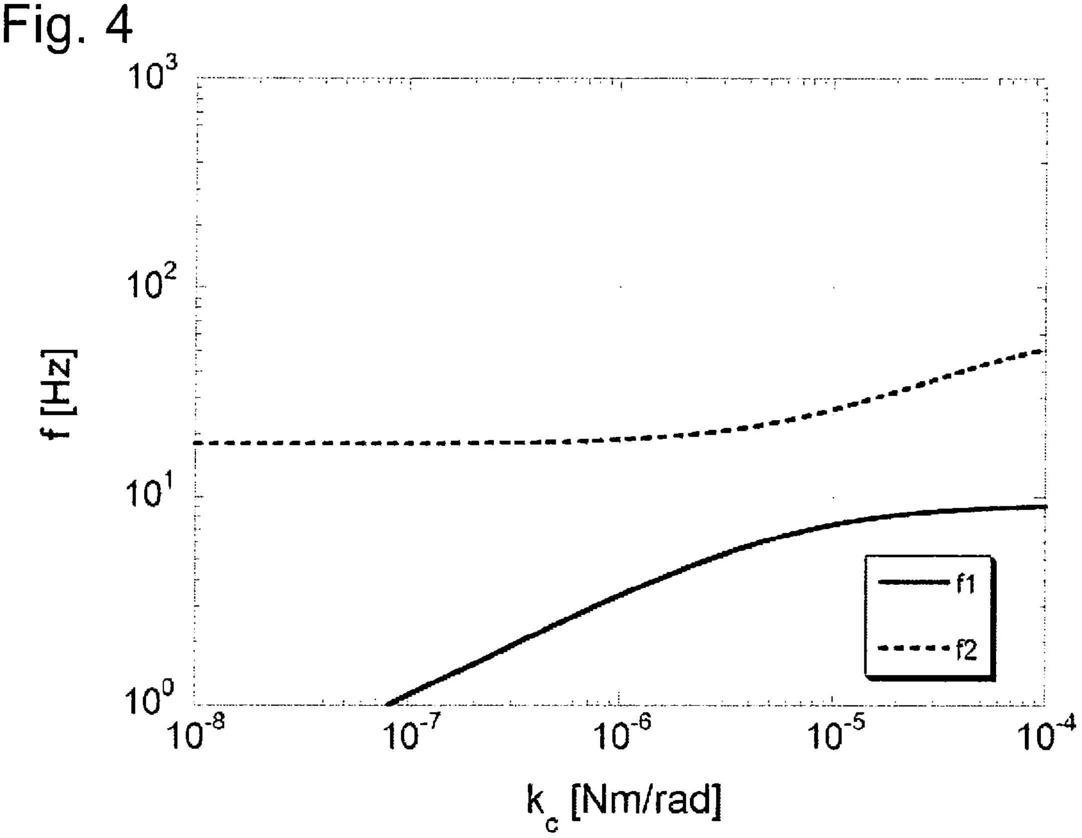
FIG. 4 is a graph showing the natural frequencies of the coupled system.
Figure 5:
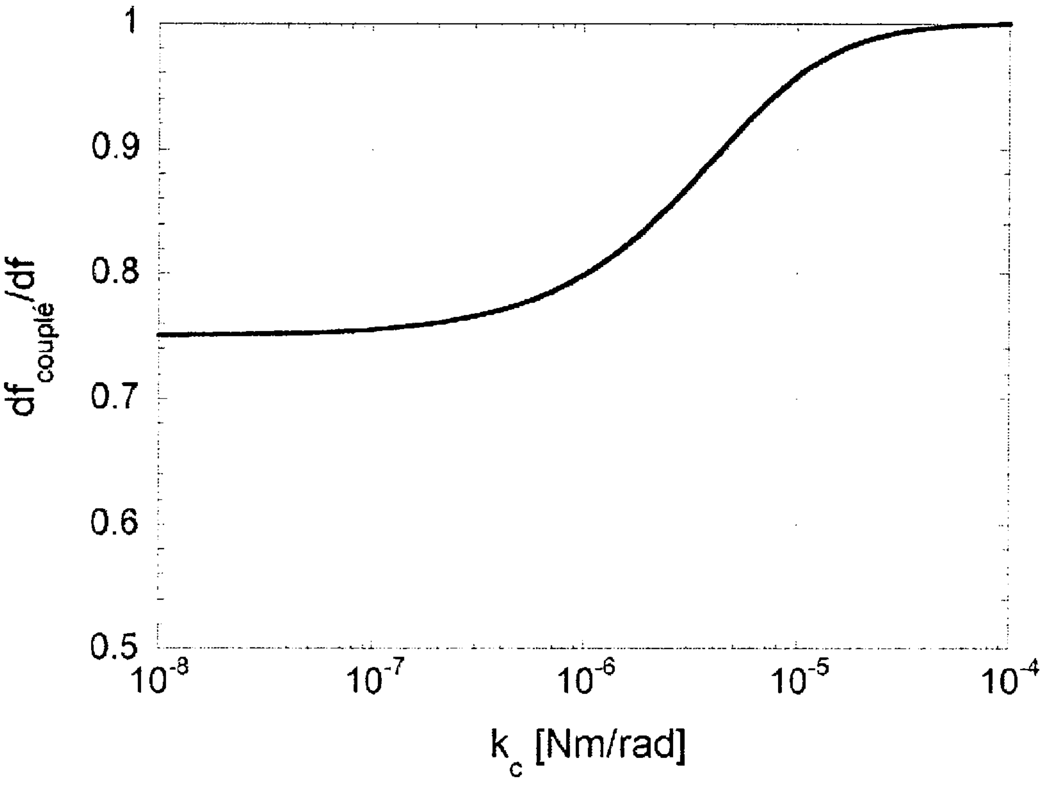
FIG. 5 is a graph showing the influence of the coupling on the frequency stability.

Referring now to FIGS. 4 and 5, an example corresponding to a coupled resonator according to the embodiment shown in FIG. 1 will now be described. The first resonator has an elastic constant $k_1=5\cdot10^{-6}$N m/rad and an inertia $I_1=16\cdot10^{-10}$ kg·m$^2$, which corresponds to a natural frequency f1=9.2 Hz. The second resonator has an elastic constant $k_2=1\cdot10^{-4}$N m/rad and an inertia of $I_2=5\cdot10^{-10}$ kg·m$^2$, which corresponds to a natural frequency of $f_2=71$ Hz. When the two resonators are mechanically coupled, the value of coupling constant "$k_c$" depends upon the shape of the foot that joins the two resonators. This coupling frequency was made to vary between the values $1\cdot10^{-8}$ and $1\cdot10^{-4}$ and is shown in FIG. 4 with a logarithmic scale of the natural frequencies of the coupled system. as can be seen, frequencies $f_1$ and $f_2$ are influenced by the variation in coupling coefficient $k_c$.

The graph of FIG. 5 shows, as a function of a variation in coupling coefficient $k_c$ within the aforementioned limits, a study of interference in the first resonator due for example to a shock, i.e. a comparison of the effect of the interference on the first resonator frequency variation when it is alone and when it is coupled to the second resonator, assumed to be stable.

As can be seen for a coupling coefficient $k_c \leqq 1.10^{-6}$ a stabilisation of more than 20% is obtained, which shows the interesting aspect of the coupled resonator of the invention for stabilizing the frequency for example that of regulating system for a timepiece, with a simple and inexpensive design.

The invention claimed is:

1. A coupled resonator including a first low frequency resonator and a second higher frequency resonator, the first resonator and the second resonator including permanent mechanical coupling means wherein the first resonator is a balance spring and in that the second resonator is a tuning fork including two arms connected by a foot, one of the arms being secured to the outer curve of the balance spring and the other arm being free.

2. The coupled resonator according to claim 1, wherein the free arm of the tuning fork further includes an inertia block able to be moved to alter the natural frequency thereof and thus to adjust the frequency of the coupled resonator.

3. The coupled resonator according to claim 1, wherein the free arm of the tuning fork further includes zones that are easy to machine in order to alter the natural frequency of said fork and thus to adjust the frequency of the coupled resonator.

4. The coupled resonator according to claim 1, wherein the foot comprises recesses in the material that will enable the coupling constant to be altered.

5. The coupled resonator according to claim 1, wherein the foot of tuning fork is secured to a fixed part.

6. The coupled resonator according to claim 5, wherein the foot of tuning fork further comprises a neck for attachment to a fixed part of the timepiece movement, and able to influence the coupling constant between the two resonators.

7. The coupled resonator according to claim 1, wherein the first resonator has a natural frequency of the order of several hertz and the second resonator has a natural frequency of the order of hundreds of hertz to several hundred hertz.

8. The coupled resonator according to claim 1, wherein the first and the second resonator are made of identical or different materials and are assembled by bonding, rivets, welding, snap fit or other means.

9. The coupled resonator according to claim 1, wherein the first and the second resonator are integral and made of the same material.

10. The coupled resonator according to claim 1, wherein the materials used for the first and second resonators are selected from among metals or alloys, or amorphous, monocrystalline or polycrystalline materials, such as glass, quartz and silicon or compounds thereof.

11. The coupled resonator according to claim 10, wherein, when the material is quartz and when said resonator has been shaped along crystallographic orientations for obtaining a piezoelectric effect, the arms of the tuning fork further comprise electrodes for generating electrical energy.

12. The timepiece with a mechanical movement, wherein it includes as a regulating system a coupled resonator according to claim 1.

* * * * *